United States Patent
Sasaki

(10) Patent No.: US 9,465,143 B2
(45) Date of Patent: Oct. 11, 2016

(54) LENS OPTICAL ELEMENT AND DISPLAY APPARATUS

(75) Inventor: Hironori Sasaki, Tokyo (JP)

(73) Assignee: Oki Data Corporation, Tokyo (JP)

(*) Notice: Subject to any disclaimer, the term of this patent is extended or adjusted under 35 U.S.C. 154(b) by 102 days.

(21) Appl. No.: 14/346,317

(22) PCT Filed: May 11, 2012

(86) PCT No.: PCT/JP2012/062135
§ 371 (c)(1),
(2), (4) Date: Jun. 24, 2014

(87) PCT Pub. No.: WO2013/042401
PCT Pub. Date: Mar. 28, 2013

(65) Prior Publication Data
US 2014/0300972 A1 Oct. 9, 2014

(30) Foreign Application Priority Data
Sep. 20, 2011 (JP) .................. 2011-204595

(51) Int. Cl.
*G02B 3/00* (2006.01)
*G02B 19/00* (2006.01)
*H01L 33/54* (2010.01)
*F21V 5/04* (2006.01)

(52) U.S. Cl.
CPC .............. *G02B 3/00* (2013.01); *F21V 5/046* (2013.01); *G02B 3/0031* (2013.01); *G02B 19/0028* (2013.01); *G02B 19/0061* (2013.01); *H01L 33/54* (2013.01)

(58) Field of Classification Search
CPC .............. F21V 5/046; G02B 19/0028; G02B 19/0061; G02B 3/00; G02B 3/0031; H01L 33/54

USPC ................ 359/586, 591–599, 641–642, 633; 362/296.1, 311.12, 361
See application file for complete search history.

(56) References Cited

U.S. PATENT DOCUMENTS

| | | | |
|---|---|---|---|
| 8,016,460 B2* | 9/2011 | Huang | G02B 27/0955 359/641 |
| 8,382,293 B2* | 2/2013 | Phillips, III | G02B 27/0955 353/102 |
| 2010/0055815 A1 | 3/2010 | Kim et al. | |
| 2010/0188018 A1* | 7/2010 | Salm | F21V 7/00 315/294 |

(Continued)

FOREIGN PATENT DOCUMENTS

| JP | H11-46013 A | 2/1999 |
|---|---|---|
| JP | 2927279 B | 7/1999 |

(Continued)

*Primary Examiner* — Scott J Sugarman
*Assistant Examiner* — Vipin Patel
(74) *Attorney, Agent, or Firm* — Mots Law, PLLC

(57) ABSTRACT

A lens optical element including an on-chip lens with a convex surface formed at a top part of a column-shaped portion; and a light emitting surface disposed in a state where the light emitting surface is covered by a bottom portion of the column-shaped portion of the on-chip lens. The relationship between a lens height, which is defined as a height from the light emitting surface to a peak of the convex surface, a thickness of the column-shaped portion, and a refractive index of a structural material of the on-chip lens is set so that when the light emitting surface emits light, a state is produced where the convex surface of the on-chip lens appears to have uniform brightness.

6 Claims, 6 Drawing Sheets

(56) References Cited

U.S. PATENT DOCUMENTS

| | | |
|---|---|---|
| 2011/0122172 A1 | 5/2011 | Tanigawa et al. |
| 2014/0038324 A1 | 2/2014 | Tanigawa et al. |

FOREIGN PATENT DOCUMENTS

| | | | |
|---|---|---|---|
| JP | 2000-114605 A | 4/2000 | |
| JP | 2000-216434 A | 8/2000 | |
| JP | 2002-221658 A | 8/2002 | |
| JP | 2002-260422 A | 9/2002 | |
| JP | H07-260422 A | 9/2002 | |
| JP | 2010-056505 A | 3/2010 | |
| JP | 2011-112737 A | 6/2011 | |
| WO | WO 2006005393 A2 * | 1/2006 | ............ H01L 33/54 |

* cited by examiner

LENS OUTER CIRCUMFERENCE

LENS OUTER CIRCUMFERENCE

BRIGHT SPOT

LENS OPTICAL ELEMENT AND DISPLAY APPARATUS

TECHNICAL FIELD

The present invention relates to a lens optical element that is equipped with a lens for controlling the spreading of light radiated from a light-emitting surface and is formed so that the entire lens surface appears uniformly bright, and to a display apparatus that uses such light-emitting elements as pixels.

BACKGROUND ART

In recent years, lighting apparatuses that use light emitting diodes (LEDs) have become widely used in a variety of fields since they have a property whereby it is possible to easily realize a panel-type lighting apparatus with low power consumption and a long lifespan. The LEDs used in such lighting apparatuses are a panel-type light emitting device where light is emitted from the surface of a semiconductor substrate and it is known that the radiation pattern of such light (hereinafter also referred to as the "light distribution pattern") has an intensity distribution that is proportional to cos θ (i.e., according to Lambert's cosine law) and can be approximated to a Lambertian surface. Here, θ is the angle made by light beams relative to a normal (the optical axis) to the light emitting surface.

Since the light distribution pattern of the light radiated from a panel-type light emitting device has Lambertian characteristics, the luminous intensity radiated in a direction inclined by 60° from the optical axis that is perpendicular to the light emitting surface will be around 50% of the luminous intensity radiated toward the optical axis, and therefore it can be understood that the light radiated from an LED light source has an extremely wide distribution on a hemispherical plane.

Although such wide-angle light distribution characteristics are favorable for applications such as a ceiling light that is a type of light fitting attached to the ceiling, for applications such as a projector light source, a spotlight and a display apparatus, light is radiated as far as unnecessary regions, and as a result there is the problem that the radiated intensity in the region where light is fundamentally necessary is insufficient.

To solve such problem, an existing LED apparatus is normally constructed by mounting an LED chip in a cup part of a lead mount, covering the LED chip and part of the lead mount with a sealing member made of a transparent resin, and forming a peak portion of such sealing member in a bullet shape to achieve the function of a convex lens. By using such construction, the diffusion of light radiated from the LED chip is controlled (see Patent Literature 1, for example).

An example of a display apparatus constructed by laying out a plurality of LED devices with bullet-shaped resin sealing constructions in two dimensions has also been disclosed (see Patent Literature 2, for example). However, when fabricating such display apparatuses, it takes a lot of work to successively mount a plurality of LED devices on a substrate. Also, since the dimensions of LED devices are as large as around several mm, it is not possible to construct a high-resolution display apparatus that has a narrow pitch. For this reason, the LED display disclosed in Patent Literature 2 and LED display apparatuses of such type are limited to applications in the field of giant display apparatuses which in practice will be set up outdoors.

To solve such practical issues, a technology that applies semiconductor processing technology to manufacture a microlens array (an array of on-chip lenses), which resembles the sealing members of bullet-shaped LED devices, on an array of light sources provided on the same substrate has been disclosed (see Patent Literature 3). By using such technology, it has become possible not only to form a lens array in a single operation but also to drastically reduce the disposing interval of lenses, which was previously limited to around several millimeters, to a level of several tens of micrometers. By doing so, this opens up the potential of display apparatuses that have the same high resolution as liquid crystal display apparatuses that have been widely commercialized but also has higher luminance than liquid crystal display apparatuses.

CITATION LIST

Patent Literature

Patent Literature 1: JP 2927279B
Patent Literature 2: JP 2000-114605A
Patent Literature 3: JP 2011-112737A

SUMMARY OF INVENTION

Technical Problem

Here, for a display apparatus constructed by disposing lens optical elements, where an on-chip lens is disposed on the light emitting surface of an LED chip or the like, in one dimension or two dimensions as pixels, when the appearance of individual pixels, that is, the image quality of the display apparatus was investigated, the following problems became clear.

For light rays emitted from the light emitting surface of an LED chip or the like, the light distribution angle of the respective light sources is controlled by changing the direction of travel by refraction at the top surface (convex surface) of the on-chip lens. In a display apparatus of this construction, it is ideal for the light emitting surface to be expanded so that the top surface of the on-chip lens appears to emit light brightly across the entire surface. That is, for each pixel of the display apparatus, the on-chip lens should preferably be formed so that instead of emitting light limited to the center portion of the pixel, an area equal to the pixel emits light brightly.

However, if the on-chip lens is designed focusing on only such light distribution characteristics, there can be cases where the entire lens corresponding to one pixel (that is, one entire pixel) appears to emit light brightly and cases where only the center of the on-chip lens emits light brightly, so that the pixel appears to have a core. That is, the intensity distribution of a near-field image at the on-chip lens surface also greatly influences the quality of images displayed by the display apparatus. Accordingly, when fabricating a display apparatus of a construction where an on-chip lens is disposed on each light emitting surface, it is necessary to optimize not only the light distribution characteristics but also the intensity distribution of the near-field image at the lens surface of each on-chip lens.

Solution to Problem

For this reason, by evaluating the near-field image that is obtained by an on-chip lens and a far-field image that reflects the light distribution characteristics, the inventor of the present application investigated the form of an on-chip lens that enables the entire lens surface to appear with a fixed intensity distribution.

As a result, it was discovered that the far-field image that provides the light distribution characteristics and the near-field image that provides the brightness distribution of the lens surface of an on-chip lens are determined by setting a lens height, which is defined as a height from the light emitting surface to a peak of the convex surface, a thickness of a column-shaped portion of the on-chip lens, and a refractive index of a structural material of the on-chip lens. It was also possible to determine setting conditions for such values to make the entire lens surface appear uniformly bright.

Accordingly, the present invention has an object of providing a lens optical element formed so that the entire lens surface appears uniformly bright and a display apparatus that has such lens optical elements as pixels.

According to aspects of the present invention, in order to achieve the above-mentioned object, there are provided a lens optical element of the construction described below and a display apparatus that has such lens optical elements as pixels A lens optical element according to the present invention is a lens optical element including an on-chip lens with a convex surface formed at a top part of a column-shaped portion, and a light emitting surface disposed in a state where the light emitting surface is covered by a bottom portion of the column-shaped portion of the on-chip lens.

A relationship between a lens height, which is defined as a height from the light emitting surface to a peak of the convex surface, a thickness of the column-shaped portion, and a refractive index of a structural material of the on-chip lens is set so that when the light emitting surface emits light, a state is produced where the convex surface of the on-chip lens appears to have uniform brightness.

The column-shaped portion of the on-chip lens is preferably cylindrical, and the lens height H, a thickness D of the column-shaped portion (=2r, where r is the radius of the column-shaped portion), and the refractive index n of the structural material of the on-chip lens should satisfy $$H < 3r/(n^2-1)^{1/2} \quad (1).$$

Also, if the column-shaped portion of the on-chip lens is a regular polygonal column, the average value of a radius $r_1$ of a circle inscribed in a regular polygon of a bottom surface of the regular polygonal column and a radius $r_2$ of a circumscribed circle corresponds to the thickness D of the column-shaped portion of the on-chip lens. That is, $(r_1+r_2)/2$ corresponds to r in Equation (1). Accordingly, if the column-shaped portion of the on-chip lens is a regular polygonal column, conditions that satisfy $$H < 3(r_1+r_2)/2(n^2-1)^{1/2} \quad (2)$$

are set.

A display apparatus according to the present invention is constructed by disposing the lens optical element described earlier in one dimension or two dimensions, wherein the peaks of the convex surfaces of the on-chip lenses are disposed at equal intervals.

Advantageous Effects of Invention

According to the lens optical element according to the present invention, since the relationship between the lens height, the thickness of the column-shaped portion, and the refractive index of the structural material of the on-chip lens is set so that the output light from the light emitting surface appears so that the convex surface of the on-chip lens has uniform brightness, the convex surface of the on-chip lens will appear uniformly bright when an LED emits light.

As described later, the inventors of the present invention confirmed through ray-trace simulation that a condition for having the convex surface of an on-chip lens appear uniformly bright when an LED emits light is determined by the lens height, the thickness of the column-shaped portion, and the refractive index of the structural material of the on-chip lens. More specifically, it was determined that such condition is satisfied if Equation (1) or Equation (2) given above is satisfied.

By using a construction where the lens optical elements according to the present invention that satisfy a condition whereby the convex surface of an on-chip lens appears uniformly bright when an LED emits light is disposed at equal intervals in one dimension or two dimensions as pixels, a superior display apparatus where every individual pixel is sharp and emits light brightly is realized.

DESCRIPTION OF EMBODIMENTS

Figure 2A:
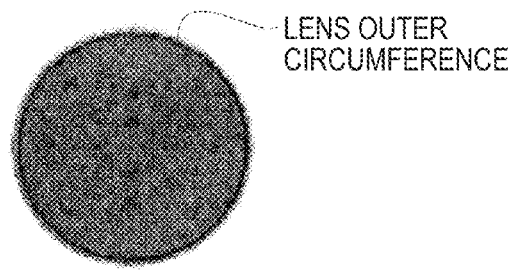
FIG. 2A is a diagram schematically showing a brightness pattern of a convex surface recognized when focusing on the convex surface from above an on-chip lens of the lens optical element, and is a diagram showing how an entire area within external dimensions of the on-chip lens viewed from above appears to emit light brightly.
Figure 2B:
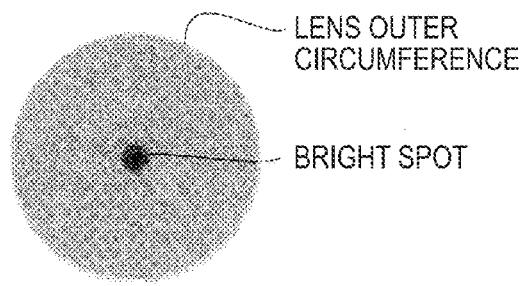
FIG. 2B is a diagram schematically showing a brightness pattern of an convex surface recognized when focusing on the convex surface from above an on-chip lens of the lens optical element, and is a diagram showing how only a center emits lights brightly making it look like a pixel has a core.
Figure 3:
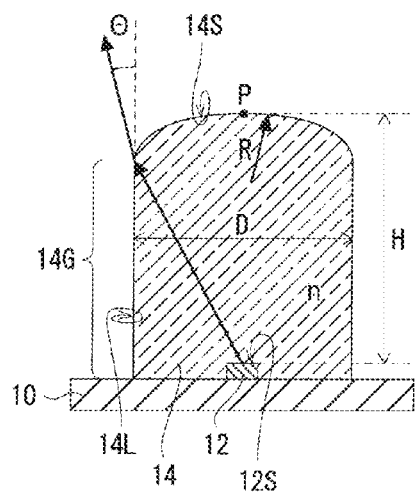
FIG. 3 is a schematic cross-sectional construction view showing a lens optical element according to an embodiment of the present invention cut on a plane that includes an optical axis of an on-chip lens provided in the apparatus.

Embodiments of the present invention will now be described with reference to FIG. 1 to FIG. 15. Note that FIG. 3, FIG. 5, and FIG. 8 illustrate example constructions of the present invention and merely illustrate the positional relationships and the like of the structural elements schematically so as to enable the present invention to be understood, and therefore the present invention is not limited to the illustrated examples. In FIG. 1 and FIG. 2, FIG. 3, FIG. 5, and FIG. 8, in some cases structural elements that are the same have been assigned the same reference numbers and repeated explanation of such elements is omitted. Also, although specific conditions and the like are used in the following description, such conditions and the like are merely favorable examples and the present invention is not limited to such.

Existing Display Apparatus

To contribute to understanding of the characteristics of the lens optical element and display apparatus according to the present invention, an overview of the display apparatus disclosed in Patent Literature 3 mentioned above will now be described with reference to FIG. 1 and FIG. 2. Note that the "light emitting surface" is the light outputting surface of an LED chip. The light emitting surface that is a structural element of the lens optical element and display apparatus according to the present invention is the light outputting surface of an LED chip, an organic EL (organic electroluminescence) chip, or the like, and any chip can be used if such light outputting surface is a light emitting surface with sufficient light distribution characteristics for irradiating the convex surface of an on-chip lens with light. That is, it is possible to use even the light outputting surface of a non-light emitting chip, such as a liquid crystal chip, if such light outputting surface has light distribution characteristics that are sufficient for irradiating the convex surface of an on-chip lens.

Figure 1:
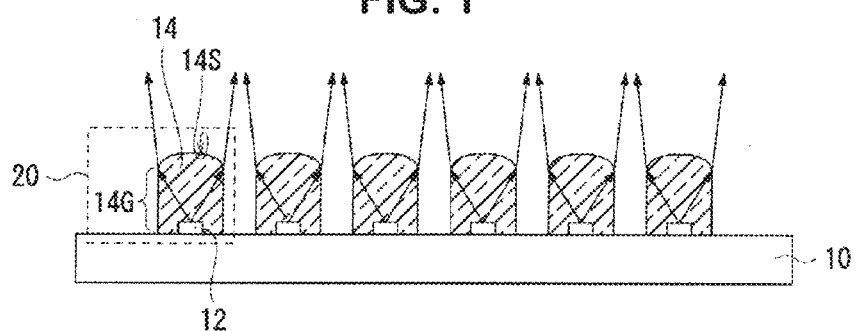
FIG. 1 is a diagram schematically showing the construction of an existing display apparatus and lens optical element.

As shown in FIG. 1, the display apparatus disclosed in Patent Literature 3 is constructed so that lens optical elements 20 are disposed at equal intervals on a shared substrate 10. The lens optical elements 20 each include an on-chip lens 14 where a convex surface 14S is formed at a top part of a column-shaped portion 14G, and an LED chip 12. The LED chip 12 is disposed so as to be covered by a bottom portion of the column-shaped portion 14G of the on-chip lens 14.

Since light rays emitted from the light emitting surface of the LED chip 12 are refracted by the convex surface 14S of the on-chip lens 14 so that the direction of travel changes, the light distribution angle of the light rays is controlled by the appropriately setting the radius of curvature of the convex surface 14S. Here, when focusing on the convex surface 14S of the lens optical elements 20 in this construction, it would be ideal for the light emitting surface of the LED chip 12, which is smaller than external dimensions of the on-chip lens 14, to be expanded to fill the entire external form of the on-chip lens 14 when looking from above and therefore be seen as brightly emitting light as the pixel of a display apparatus.

Focusing on the convex surface 14S from above the on-chip lens 14 of a lens optical element 20 that constructs the display apparatus shown in FIG. 1, the way in which such convex surface 14S normally appears to emit light will now be described with reference to FIGS. 2A and B. FIGS. 2A and B show brightness patterns within the external dimensions of the on-chip lens 14 which is viewed from above for a case where the column-shaped portion 14G is cylindrical.

If the on-chip lens 14 is designed focusing on only the light distribution characteristics, as shown in FIG. 2A, in some cases the entire lens surface of the on-chip lens 14 when viewed from above will appear to be emitting light with substantially uniform brightness. As shown in FIG. 2B, there are also cases where only the center of the on-chip lens 14 brightly emits light, making it appear as if the pixel has a core.

In a case where the column-shaped portion 14G is a polygonal column also, although omitted from the drawings, in the same way, there are cases where the lens surface appears to emit light substantially uniformly and cases where the brightness appears to be off-center. In cases where the brightness appears to be off-center, instead of appearing as if there is a core, it appears as if a bright part is distributed in an approximate ring shape so as to surround the optical axis.

Accordingly, as described above, to make the convex surface 14S appear with uniform brightness, it is necessary to decide the shape of the on-chip lens 14 with consideration not only to the light distribution characteristics but also to the near-field image at the convex surface 14S.

Lens Optical Element

The construction of the lens optical element according to an embodiment of the present invention will now be described with reference to FIG. 3. FIG. 3 schematically shows a lens optical element according to the present invention cut on a plane including the optical axis of the on-chip lens provided in such apparatus.

In this lens optical element, an LED chip 12 is disposed on the shared substrate 10 and the LED chip 12 is disposed on a bottom portion of the on-chip lens 14. The LED chip 12 is equipped with the light emitting surface 12S. The LED chip 12 is housed and disposed in a state where the LED chip 12 is covered by the bottom portion of the on-chip lens 14, so that the light emitting surface 12S is positioned at the bottom portion of the column-shaped portion 14G of the on-chip lens 14.

Case where the Column-Shaped Portion of the on-Chip Lens is Cylindrical

The column-shaped portion 14G of the on-chip lens 14 is cylindrical and the convex surface 14S is formed at the top part of the column-shaped portion 14G. The lens height H, which is defined as the height from the light emitting surface 12S to the peak P of the convex surface, the thickness D (=2r, where r is the radius of the column-shaped portion 14G) of the column-shaped portion 14G, and the refractive index n of the structural material of the on-chip lens are set so that when the light emitting surface 12S emits light, the convex surface 14S of the on-chip lens 14 is in a state where the convex surface 14S appears to have uniform brightness.

Here, the on-chip lens 14 was constructed of a mold material that is transparent and has a refractive index of 1.58. The convex surface 14S at the top part of the on-chip lens 14 (hereinafter also referred to as the "lens surface of the on-chip lens" or simply as the "lens surface") is a spherical surface with a fixed radius of curvature.

Although the lens surface 14S of the on-chip lens is described here as a spherical surface, such surface may be aspherical. By making the surface aspherical, although it becomes possible to make the near-field image and/or far-field image, described later, much more ideal, design becomes complex and advanced technology becomes necessary for manufacturing.

Also, although an LED chip is described here as an example of an element that provides a light emitting surface, as described earlier, the lens optical element according to an embodiment of the present invention is not limited to using an LED chip as a light emitting chip.

As shown in FIG. 3, the light rays emitted from the light emitting surface 12S are outputted having been refracted by the convex surface 14S at the top part of the on-chip lens 14.

Here, the light distribution angle θ is defined as described below is used as a convenient parameter expressing the magnitude of the change in the direction of travel of light rays by such refraction. A light distribution angle at the line of intersection (hereinafter also referred to as the "lens outer circumference") between the column-shaped portion 14G of the on-chip lens 14 and the lens surface (the convex surface 14S) is referred to as the "light distribution angle θ".

Figure 4:
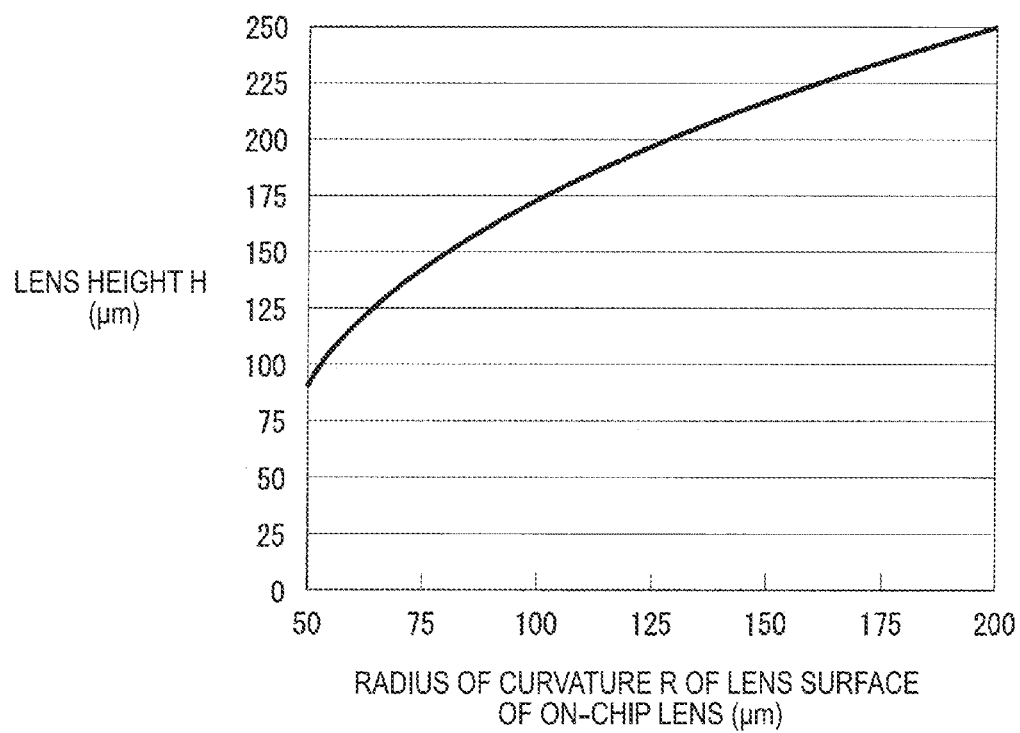
FIG. 4 is a diagram showing a relationship of a lens height H with respect to a radius of curvature R of an on-chip lens where the column-shaped portion is a cylinder.
Figure 5:
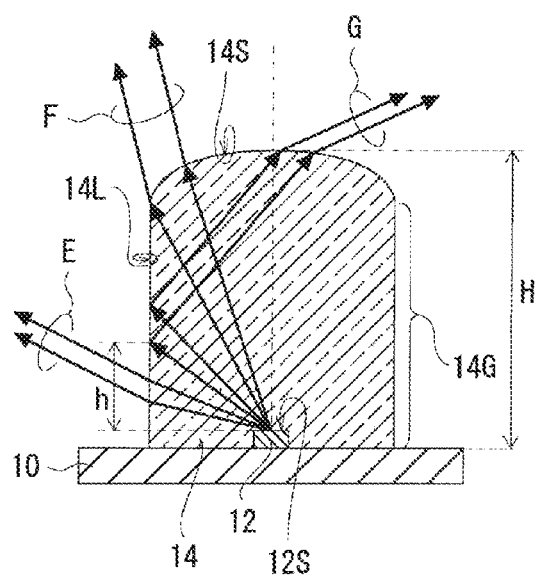
FIG. 5 is a diagram useful in explaining light rays belonging to three groups emitted from the light emitting surface and emitted from the on-chip lens.

FIG. 4 shows the relationship of the lens height H with respect to the radius of curvature R of the convex surface 14S of the on-chip lens for a case where the light distribution angle θ is fixed at 10°. It is assumed that the diameter of the on-chip lens is 100 µm. The horizontal axis in FIG. 4 shows the radius of curvature R of the lens surface with µm units as the scale and the vertical axis shows the lens height H with µm units as the scale. From such drawing, it can be understood that there are infinite combinations of the radius of curvature R of the lens surface 14S and the lens height H for on-chip lenses that realize an arbitrary light distribution angle θ.

That is, fixing the light distribution angle θ corresponds to fixing the far-field image, and for the combinations of the radius of curvature R and the lens height H that satisfy the relationship expressed by the curve shown in FIG. 4, the far-field image will be the same. Accordingly, even if the far-field image is the same, it is possible to decide the form of the on-chip lens 14 so that the near-field image differs.

Light rays emitted from the on-chip lens 14, including the light rays emitted from the column-shaped portion 14G, are divided into three groups. The light rays belonging to such three groups will now be described with reference to FIG. 5. FIG. 5, in the same way as FIG. 3, is a drawing schematically showing the lens optical element according to the present invention cut on a surface including the optical axis of the on-chip lens provided in such apparatus, and the light rays belonging to the three groups are respectively shown as E, F, and G.

The light rays belonging to group E are light rays that are emitted from the light emitting surface 12S, travel so as to strike a side wall surface 14L of the column-shaped portion of the on-chip lens 14 with an angle that is lower than the critical angle, and propagate to the outside as they are without being totally reflected. The light rays belonging to the group F are light rays that reach the convex surface 14S of the on-chip lens without reaching the side wall surface 14L of the column-shaped portion of the on-chip lens 14 and are propagated to the outside having been refracted at the convex surface 14S. The light rays belonging to the group F are light rays that decide the light distribution characteristics of the on-chip lens 14. The light rays belonging to the group G are light rays that reach the lens surface 14S of the on-chip lens 14 having been totally reflected by the side wall surface 14L of the column-shaped portion 14G of the on-chip lens 14 and propagate to the outside having been refracted at the convex surface 14S. Depending on the combination of the lens height H and the radius of curvature R of the lens surface, the light rays belonging to the group G include light rays that are totally reflected by the lens surface 14S of the on-chip lens and not emitted to the outside.

Although the light rays emitted from the light emitting surface 12S and emitted from the on-chip lens 14 are classified into the three groups E, F, and G as described above, such light ray groups shown in FIG. 5 are meridional rays of the on-chip lens 14. Aside from such rays, the light rays emitted from the light emitting surface 12S also include sagittal rays. Since the drawing would become extremely complex if sagittal rays were also included in the illustration, sagittal rays are not shown in FIG. 5.

Ray-trace simulation was carried out by selecting a plurality of both the meridional rays and sagittal rays emitted from the light emitting surface 12S to find the near-field image and the far-field image.

Figure 6:
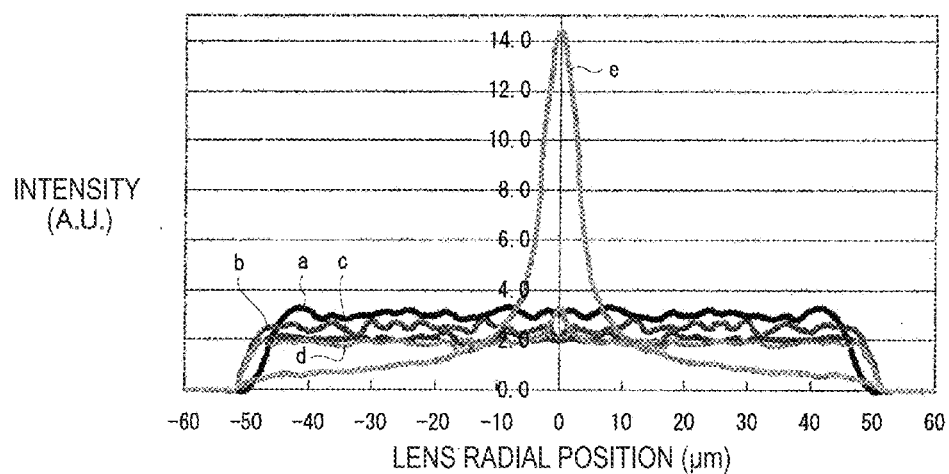
FIG. 6 is a diagram showing near-field images obtained based on a ray-trace simulation for a case where the column-shaped portion of the on-chip lens is a cylinder.
Figure 7:
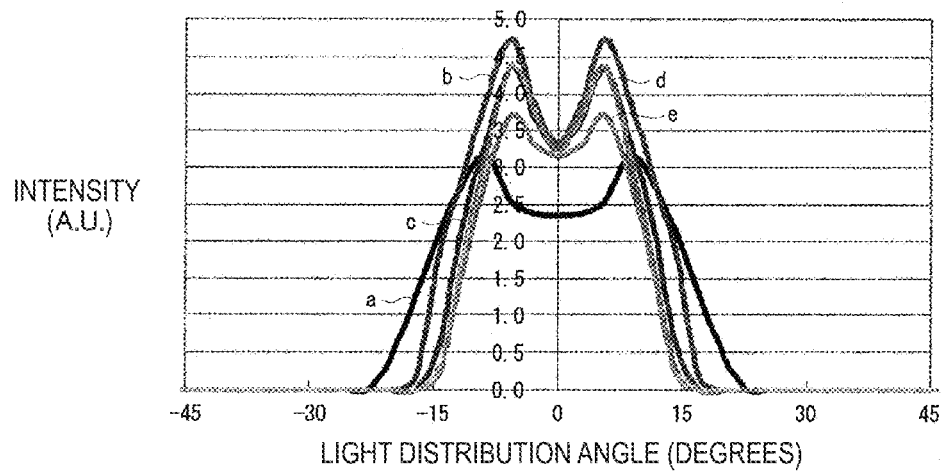
FIG. 7 is a diagram showing far-field images obtained based on a ray-trace simulation for a case where the column-shaped portion of the on-chip lens is a cylinder.
Figure 8:
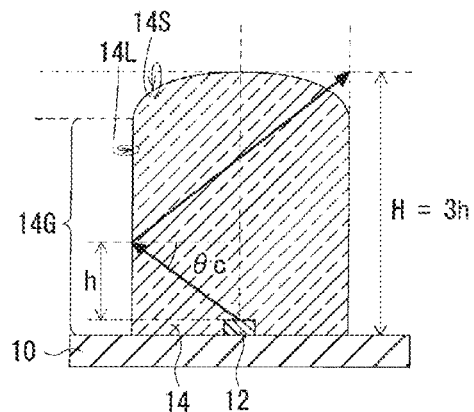
FIG. 8 is a diagram useful in explaining a critical condition that can realize a state where the lens surface appears uniformly bright.

Near-field images obtained based on the ray-trace simulation are shown in FIG. 6 and far-field images are shown in FIG. 7. Here, the intensity distribution of light at the lens surface 14S of the on-chip lens is set as the near-field image.

Although the far-field image is expressed as the luminous intensity with respect to the light distribution angle, such far-field image has similarity with the luminous intensity distribution measured at positions 20 mm away from the lens surface. For this reason, as the far-field image that provides the light distribution pattern characteristics, the luminous intensity distribution measured at positions 20 mm away from the lens surface was set as the far-field image. Positions 20 mm away from the lens surface can be regarded as positions sufficiently far from an on-chip lens 14 for which the lens height H is around 0.1 mm and the radius of curvature R is around 0.05 mm. Accordingly, there is sufficient rationale to regard a luminous intensity distribution measured on a hemispherical plane that is placed perpendicular to the optical axis and has a radius of curvature equal to a value given by adding 20 mm to the radius of curvature of the on-chip lens 14 as the far-field image.

The horizontal axis in FIG. 6 shows a distance along the radial direction of the lens with the center of the lens surface as the origin and µm units as the scale and the vertical axis shows the luminous intensity with an arbitrary scale. Curve a to curve e respectively show the near-field image of an on-chip lens formed so that the lens height H and the radius of curvature R of the lens surface are given by the conditions below. For curve a, (H,R)=(90 µm,50.0 µm), for curve b, (H,R)=(100 µm,52.5 µm), for curve c, (H,R)=(110 µm,56.7 µm), for curve d, (H,R)=(115 µm,59.0 µm), and for curve e, (H,R)=(120 µm, 62.0 µm).

The horizontal axis in FIG. 7 shows the light distribution angle with degree units as the scale and the vertical axis shows the luminous intensity with an arbitrary scale. That is, the horizontal axis has an intersection on a hemispherical plane between the optical axis and a hemispherical plane that is positioned 20 mm away from the lens surface and has a radius of curvature equal to a value given by adding 20 mm to the radius of curvature of the on-chip lens 14 as the origin, and shows points where light rays corresponding to the respective light distribution angles intersect the hemispherical plane as such light distribution angles. The vertical axis shows the luminous intensity at respective points on such plane as the light intensity for the light distribution angles corresponding to such points.

The far-field images were also found by imagining on-chip lenses where the lens height H and the radius of curvature R of the lens surface satisfy the same five conditions as the near-field images. That is, curve a to curve e show far-field images found by imagining on-chip lenses of a form where the lens height H and the radius of curvature R of the lens surface satisfy the same five conditions as the near-field images.

For the respective combinations of the lens height H and the radius of curvature R of the lens surface corresponding to curve a to curve e described earlier, the position of the light emitting surface 12S is set so that the light distribution angle θ is 10°. Setting the light distribution angle θ sufficiently low in this way means that the position of the light emitting surface 12S is set as to be placed at substantially the focus position of the on-chip lens 14 which is decided by the lens height H and the radius of curvature R of the lens surface.

By setting the relationship between the lens height H and the radius of curvature R of the lens surface in this way, even if the position of the light emitting surface 12S is somewhat displaced in a direction perpendicular to the optical axis, there will be little influence on the near-field image and the far-field image. Accordingly, when forming the lens optical element according to the present invention, it is favorable to set the position of the light emitting surface 12S so as to be placed at substantially the focus position of the on-chip lens 14.

In the ray trace simulation, the light emitting surface 12S is assumed to be a square with 10 μm sides and to have optical characteristics as a Lambertian surface. When finding the near-field images and the far-field images, 500,000 rays were used. Such 500,000 rays were set so that the light emission point distribution and the radiation angle distribution of the light emitting surface 12S are respectively equal.

As shown in FIG. 6, in the near-field images that are the brightness distribution of the lens surface of the on-chip lens, the intensity at the center position of the lens surface rapidly increases when the lens height H is 120 μm. When the lens height is set at other dimensions, the intensity is substantially equal across the entire lens surface.

It is understood that the intensity of the near-field image at the center position of the lens surface takes a large value because the proportion of light rays totally reflected by the side wall surface 14L of the column-shaped portion of the on-chip lens 14 has increased. Also, it is believed that since the form of the on-chip lens 14 is symmetrical with respect to the optical axis of the lens, the light rays that are totally reflected by the side wall surface 14L of the column-shaped portion will be concentrated in the center of the lens surface and the intensity at the optical axis will become locally higher. Meanwhile, as shown in FIG. 7, although the far-field image has a maximum intensity when the lens height H is set at 100 μm, the form of the far-field image is substantially the same form regardless of the lens height H.

As described above, although the form of the far-field image is hardly influenced by the lens height H, the form of the near-field image is strongly influenced by the lens height H. That is, it is understood that it is the near-field image that decides the impression received when the lens surface 14S is viewed. The state where the intensity of the near-field image increases so as to be concentrated in the center position of the lens surface appears as a state where there is a so-called "core", that is, only the center part of the convex surface 14S is bright.

Since the intensity of the near-field image is concentrated in a center position of the lens surface due to light rays that are totally reflected by the side wall surface 14L of the column-shaped portion of the on-chip lens 14 as described earlier, by setting the lens height H lower than a certain value, it is possible to prevent the intensity on the optical axis from locally increasing. That is, it is understood that if the lens height H is set lower than the certain value, it is possible to realize a state where the lens surface 14S appears to be uniformly bright.

The relationship between the lens height H that provides the critical condition capable of realizing a state where the lens surface 14S appears uniformly bright, the radius r of the column-shaped portion 14G, and the refractive index n of the structural material of the on-chip lens will now be described with reference to FIG. 8. FIG. 8 shows the minimum height h at which light rays are totally reflected by the side wall surface 14L of the column-shaped portion of the on-chip lens 14 and the critical angle θc for the incident angle of light rays that satisfies the total reflection condition. When the refractive index n of the structural material of the on-chip lens is 1.58, the θc=39°. If the radius r of the column-shaped portion 14G is 50 μm, the corresponding height is 40 μm.

When the lens height H is set at 120 μm, the near-field image shown in FIG. 6, that is, the intensity in the center position of the convex surface 14S, spikes at a large value, which corresponds to three times the height h (=40 μm). This means that if the lens height H is set at a lower value than 120 μm when the critical angle θc is 39°, it is possible to realize a state where the lens surface appears to be uniformly bright.

When expressed as an equation, such condition is as shown below.

$$θc=\arcsin(1/n)$$

$$H<3r \tan θc=3r/(n^2-1)^{1/2} \qquad (1)$$

Case where the Column-Shaped Portion of the on-Chip Lens is a Polygonal Column

An example where the column-shaped portion 14G of the on-chip lens 14 is a square column and the convex surface 14S is formed at the top part of the column-shaped portion 14G will now be described. The relationship between the lens height H, which is defined as the height from the light emitting surface 12S to the peak P of the convex surface, the thickness D of the column-shaped portion 14G, and the refractive index n of the structural material of the on-chip lens is set so that when the light emitting surface 12S emits light, the convex surface 14S of the on-chip lens 14 is in a state that appears to be uniformly bright.

In the ray trace simulation, the light emitting surface 12S is assumed to be a square with 10 μm sides and to have optical characteristics as a Lambertian surface. Also, the length of the sides of the square column that constructs the column-shaped portion 14G was set at 100 μm. When finding the near-field images and the far-field images, 500,000 rays were used in the same way as the case described above where the column-shaped portion 14G of the on-chip lens 14 is a cylinder. Such 500,000 rays were set so that the light emission point distribution and the radiation angle distribution of the light emitting surface 12S are respectively equal.

Figure 9:
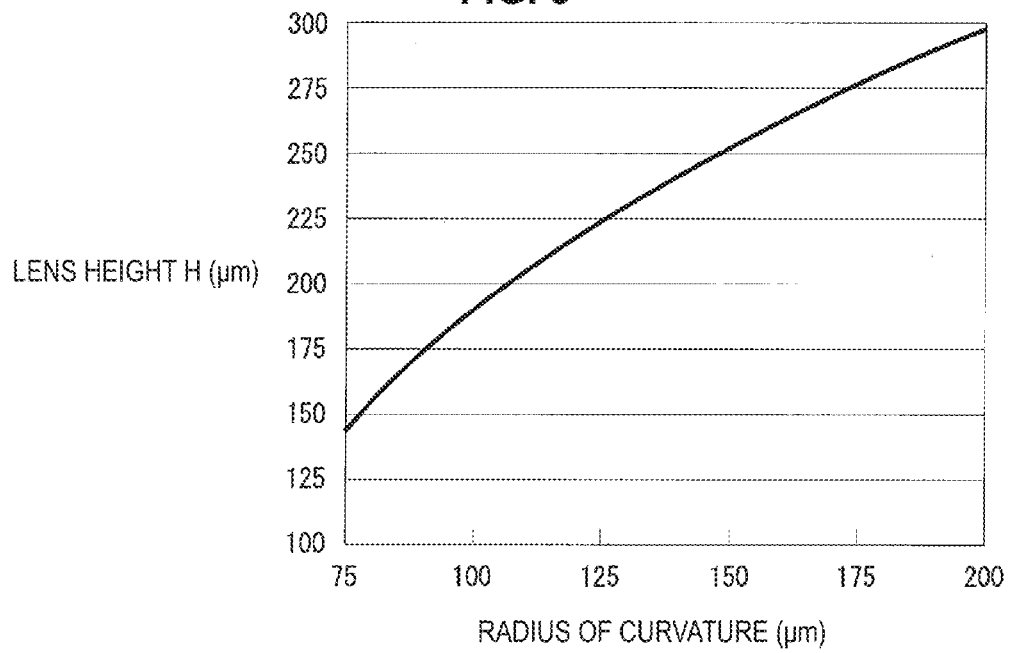
FIG. 9 is a diagram showing a relationship of the lens height H with respect to the radius of curvature R of the lens surface of an on-chip lens where the column-shaped portion is a square column.

FIG. 9 shows the relationship of the lens height H with respect to the radius of curvature R of the lens surface of the on-chip lens for a case where the light distribution angle θ is fixed at 10°. The horizontal axis in FIG. 9 shows the radius of curvature R of the lens surface with μm units as the scale, and the vertical axis shows the lens height H with μm units as the scale. Although the shape of the lens outer circumference is substantially square reflecting the fact that the column-shaped portion 14G of the on-chip lens 14 is a square column, it is assumed that the light distribution angle θ is the light distribution angle at a position on the lens outer circumference furthest from the center of the lens surface. However, although the form of the lens outer circumference is substantially square, such shape is very close to a circle, which means that the light distribution angle also has a substantially equal value at any point on the lens outer circumference.

In the same way as the curve shown in FIG. 4, with a combination of a radius of curvature R and a lens height H that satisfy the relationship expressed by the curve shown in FIG. 9, it is always possible to set the light distribution angle θ at 10°. Even when the column-shaped portion 14G of the on-chip lens 14 is a square column, it is possible to decide the shape of the on-chip lens so that the far-field image differs even for the same far-field image.

Figure 10:
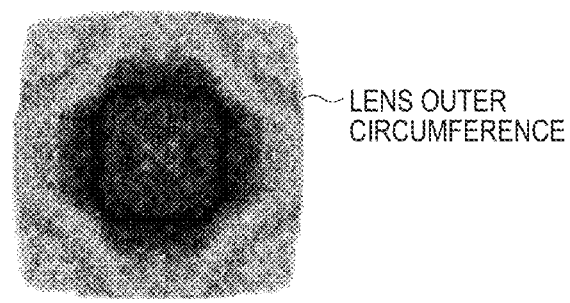
FIG. 10 is a diagram showing a near-field image of a lens optical element.
Figure 11:
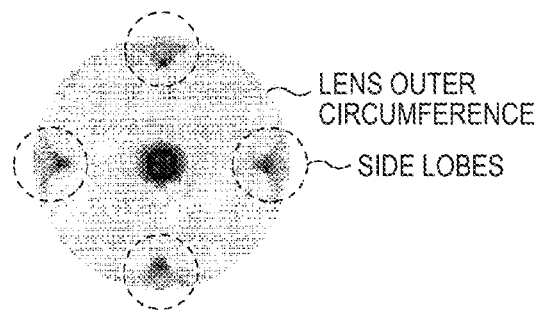
FIG. 11 is a diagram showing a far-field image of a lens optical element.

Out of the conditions that satisfy the relationship of the lens height H with respect to the radius of curvature R of the lens surface shown in FIG. 9, the simulation results for the near-field images and the far-field images for the case where the lens height H is 170 μm and the radius of curvature R is 87.5 μm are shown in FIG. 10 and FIG. 11, respectively. In FIG. 10 and FIG. 11, shading has been applied corresponding to the intensity distribution of light.

Regarding the near-field image shown in FIG. 10, the external form of the lens outer circumference is substantially square with some rounding reflecting the fact that the column-shaped portion 14G of the on-chip lens 14 is a square column. From this near-field image, it can be visually confirmed that a bright part is concentrated in a center part of the lens surface.

Although omitted from the drawings, in the same way, when the column-shaped portion 14G is a cylinder, the external form of the lens outer circumference is a circle, and the bright part is concentrated in a center part of the lens surface. However, when the on-chip lens 14 is a cylinder, compared to when a square column is used, the bright part of the near-field image is more strongly concentrated in the center part. That is, if the column-shaped portion 14G is a square column, the bright part of the near-field image becomes wider. This is because when the column-shaped portion 14G is a cylinder, the side wall surface 14L has a curved form and there is a tendency for the light rays totally reflected by the side wall surface 14L to be concentrated near the optical axis of the lens.

Meanwhile, the far-field image shown in FIG. 11 has a bright part in the center part in the same way as the near-field image, but there are also localized bright parts at four positions around the bright part in the center part. The parts that locally appear to be bright in the periphery of the center part are referred to as "side lobes". Such side lobes rarely appear in the case where the column-shaped portion 14G is cylindrical. The reason for this is that although the rays that are totally reflected at the side wall surface of an on-chip lens where the column-shaped portion 14G is cylindrical are concentrated near the optical axis of the lens surface and then diffuse as such rays move away from the lens surface, it is believed that for an on-chip lens where the column-shaped portion 14G is a square column, instead of the light rays totally reflected by the side wall surface being concentrated near the optical axis of the lens surface, the light rays travel so as to be parallel to one another after being emitted from the lens surface.

Figure 12:
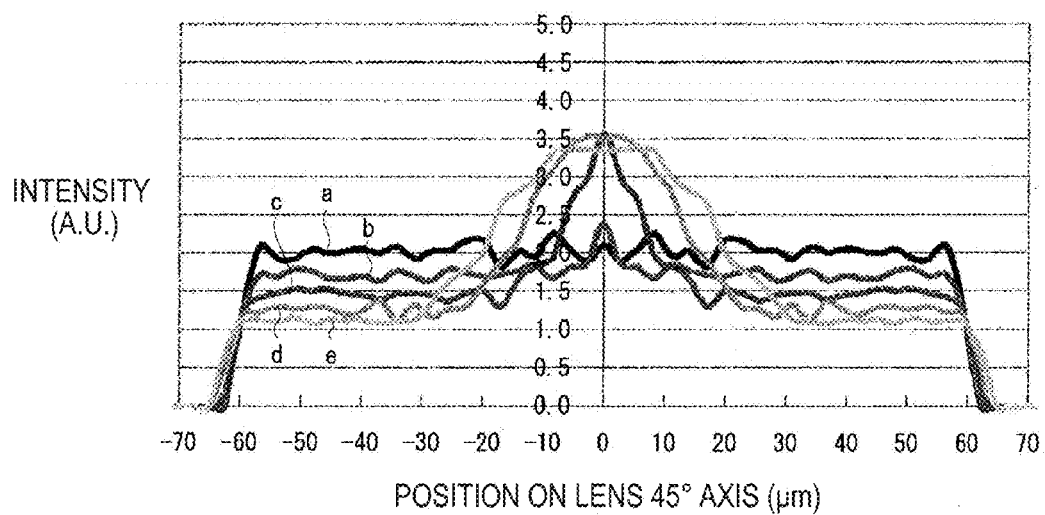
FIG. 12 is a diagram showing near-field images obtained based on a ray-trace simulation for a case where the column-shaped portion of the on-chip lens is a cylinder.
Figure 13:
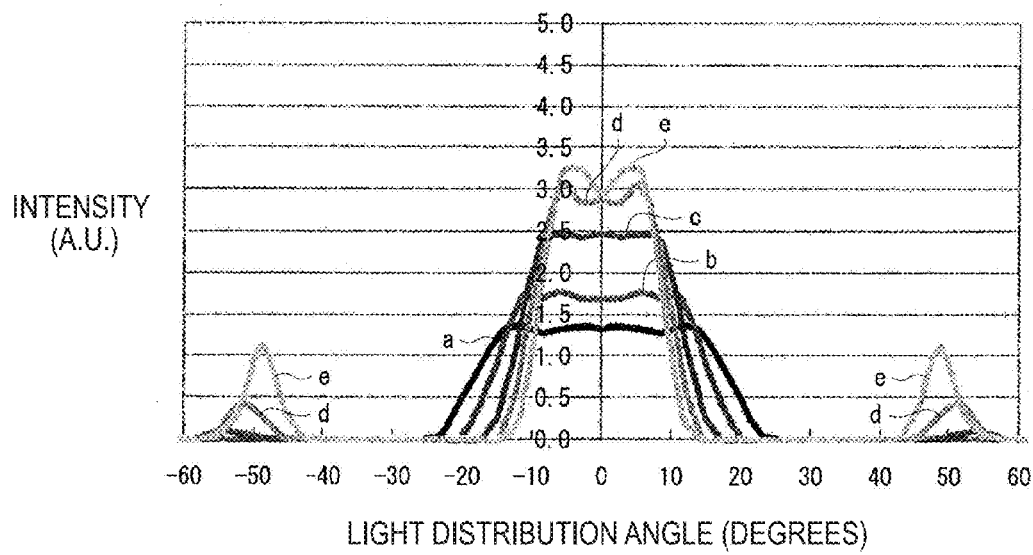
FIG. 13 is a diagram showing far-field images obtained based on a ray-trace simulation for a case where the column-shaped portion of the on-chip lens is a cylinder.

Next, based on ray trace simulations, the near-field images obtained by on-chip lenses with five types of form that satisfy the conditions in FIG. 9 are shown in FIG. 12 and the far-field images are shown in FIG. 13.

Here also, the intensity distribution of light at the lens surface 14S of the on-chip lens 14 was set as the near-field image. Also, the luminous intensity distribution measured on a plane placed perpendicular to the optical axis at a position 20 mm away from the lens surface was set as the far-field image.

The horizontal axis in FIG. 12 shows a distance along the radial direction of the lens with the center of the lens surface as the origin and μm units as the scale, and the vertical axis shows the luminous intensity with an arbitrary scale. Also, the near-field images shown in FIG. 12 are intensity distributions on the diagonal of a square.

Curve a to curve e respectively show the near-field image of an on-chip lens formed so that the lens height H and the radius of curvature R of the lens surface are given by the conditions below. For curve a, (H,R)=(110 μm,71.0 μm), for curve b, (H,R)=(120 μm,71.0 μm), for curve c, (H,R)=(130 μm,71.0 μm), for curve d, (H,R)=(140 μm,74.0 μm), and for curve e, (H,R)=(150 μm,77.5 μm).

Here, the reason that the radius of curvature R was set the same at 71.0 μm for any of the lens heights H of 110 μm, 120 μm, and 130 μm will be described. As described earlier, according to the relationship where the length of the sides of the square column that constructs the column-shaped portion 14G is set at 100 μm, the length of a diagonal of the square shape of a perpendicular cross section of the column-shaped portion (the bottom surface of the column-shaped portion) will be around 141 μm. Accordingly, when the radius of curvature R of the lens surface is equal to or below 141 μm, it becomes no longer possible to form the lens surface 14S of the column-shaped portion as a uniformly spherical surface. For this reason, as a condition that makes it possible to form the lens surface 14S of the column-shaped portion as a uniformly spherical surface, the value of the radius of curvature R of the lens surface was set at 71.0 μm to have some leeway with respect to 70.5 μm which corresponds to half the length of the diagonal of the square that is the perpendicular cross section of the column-shaped portion.

In this way, although the characteristics of the light distribution angle slightly differ for curve a to curve c compared to curve d and curve e, such difference is extremely small and of a size that can be ignored.

The horizontal axis in FIG. 13 shows the light distribution angle with degree units as the scale and the vertical axis shows the luminous intensity with an arbitrary scale. Note that the far-field images shown in FIG. 13 are light distributions in a direction along the side of a square.

The far-field images were also found by imagining an on-chip lens of a form where the lens height H and the radius of curvature R of the lens surface satisfy the same five conditions as the near-field images. That is, curve a to curve e shows far-field images found by imagining on-chip lenses of a form where the respective lens height H and the radius of curvature R of the lens surface satisfy the same five conditions as the near-field images.

Here also, the respective combinations of the lens height H and the radius of curvature C of the lens surface corresponding to curve a to curve e described above are decided so that the position of the light emitting surface 12S comes at substantially the focus position of the on-chip lens 14 which is decided by the lens height H and the radius of curvature R of the lens surface.

As shown in FIG. 12, even if the lens height H is increased, the increase in light intensity at the center of the lens surface will be kept to a lower value compared to the case where the column-shaped portion 14G is a cylinder.

Meanwhile, as shown in FIG. 13, it can be understood that if the lens height H is set at a certain value or higher, side lobes will appear more conspicuously in the far-field images. Although omitted from the drawing, if the lens height H is increased to 170 μm, the luminous intensity on the optical axis and the luminous intensity of the side lobes will have the same magnitude.

If side lobes are generated in this way, when a display apparatus constructed by disposing such lens optical elements as pixels is viewed with the naked eye, the side lobe components act as stray light and cause a drop in the sharpness of the images displayed on the display apparatus.

From the near-field images and the far-field images shown in FIG. 11 and FIG. 12 respectively, it is understood that even when the column-shaped portion 14G is a square column, in the same way as a lens optical element including an on-chip lens where the column-shaped portion 14G is cylindrical, there is an upper limit value that is desirable for the lens height H. That is, if the lens height H is set lower than a certain value, it is possible to realize a state where the lens surface appears uniformly bright.

Figure 14:
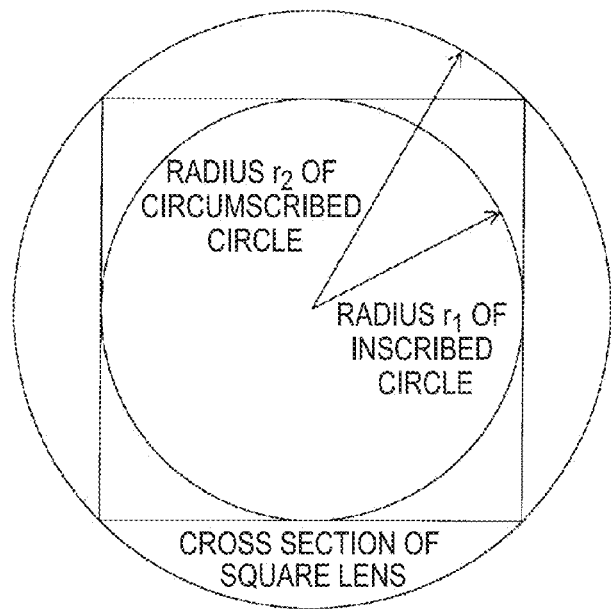
FIG. 14 is a diagram showing a square lens cross section where a square column that constructs the column-shaped portion of an on-chip lens has been cut on a plane perpendicular to the optical axis, and the radius of an inscribed circle and radius of a circumscribed circle of such square lens cross section.

The upper limit value of the lens height H that provides the critical condition which enables the realization of a state where the lens surface appears uniformly bright is investigated here with reference to FIG. 14. FIG. 14 shows, as the cross section of a square lens, the form of a cross section (the bottom surface of the square column) when the square column that constructs the column-shaped portion 14G of the on-chip lens 14 has been cut on a plane that is perpendicular to the optical axis. The radius of a circle inscribed in this square lens cross section is set as $r_1$ and the radius of a circumscribed circle is set as $r_2$. The average value $(r_1+r_2)/2$ of the radius $r_1$ of the inscribed circle and the radius $r_2$ of the circumscribed circle is defined as ½ of the thickness D of the column-shaped portion of the on-chip lens. That is, the upper limit of the lens height H was calculated by using the average value $(r_1+r_2)/2$ as a value corresponding to the radius r of the on-chip lens described above where the column-shaped portion 14G is cylindrical.

The relationship between the radius $r_1$ of the inscribed circle of the column-shaped portion 14G of a square column, the radius $r_2$ of the circumscribed circle, and the refractive index n of the structural material of the on-chip lens will now be described. The minimum height h is defined at which light rays are totally reflected at the side wall surface 14L of the column-shaped portion 14G of the on-chip lens 14 and the critical angle for the incident angle of the light rays that satisfy the total reflection condition is set at θc.

The condition equation that gives the upper limit value of the lens height H that provides the critical condition which enables the realization of a state where the lens surface appears uniformly bright is as follows.

$$\theta c = \arcsin(1/n)$$

$$H < 3(r_1+r_2)/2 \tan \theta c = 3(r_1+r_2)/2(n^2-1)^{1/2} \quad (2)$$

Figure 15:
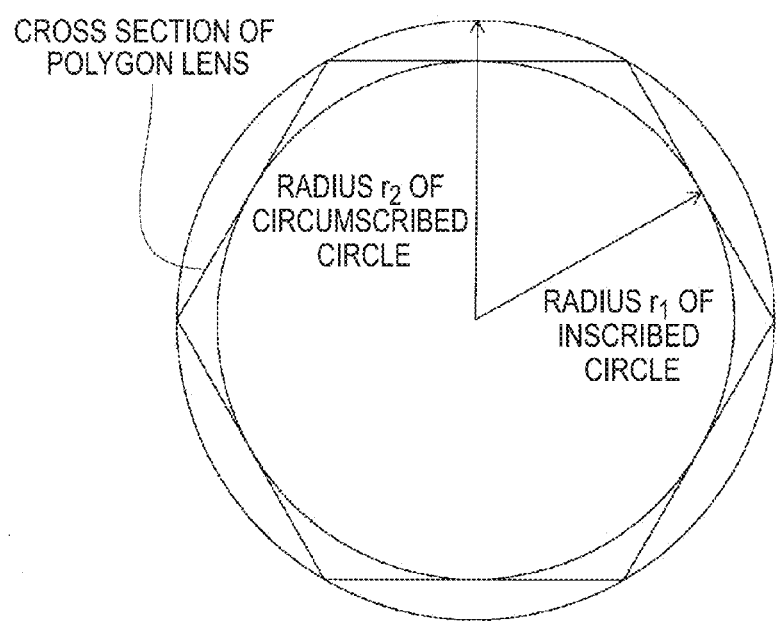
FIG. 15 is a diagram showing a regular polygon lens cross section where a regular polygonal column that constructs the column-shaped portion of an on-chip lens has been cut on a plane perpendicular to the optical axis, and the radius of an inscribed circle and radius of a circumscribed circle of such regular polygon lens cross section.

Normally, if the column-shaped portion 14G is a regular polygonal column, as shown in FIG. 15, if the radius r1 of an inscribed circle for such regular polygon and the radius r2 of the circumscribed circle are set as shown in FIG. 15, the critical condition which enables the realization of a state where the lens surface appears uniformly bright is provided by Equation (2) above.

Since a circle is approached as the number of sides of a regular polygon increases, by constructing the column-shaped portion 14G as a regular polygonal column where a perpendicular cross section is a regular polygon and appropriately selecting the number of sides of such regular polygon so as to increase, it is possible to make it difficult for side lobes to be generated in the far-field image. Also, as described earlier, since it is difficult, compared to the case of a cylinder, for the bright part of the near-field image to be concentrated in a center part if the column-shaped portion 14G is a square column, by appropriately selecting the number of sides so that the number of sides of such polygon decreases, it is easy to realize a state where the lens surface appears uniformly bright.

Accordingly, by increasing and decreasing the number of sides of a regular polygon, it is possible to adjust non-uniformity in the intensity of the near-field image and the extent to which side lobes that appear in the far-field image are generated. That is, by selecting whether to make the form of the column-shaped portion of the on-chip lens a cylinder or a regular polygonal column and increasing or decreasing the number of sides of the regular polygon if a regular polygon is used, it is possible to design a favorable lens optical element in accordance with the application of the display apparatus in which the lens optical element is used.

Also, by making the column-shaped portion 14G a square column, in a display apparatus in which the lens optical elements are aligned on a two-dimensional plane, it is possible to dispose the lens optical elements as pixels without gaps across the entire plane. Although gaps are produced between adjacent pixels when the column-shaped portion 14G is a cylinder, if the cross-sectional form of the column-shaped portion 14G is a regular polygon that can be fitted onto a two-dimensional plane with no gaps, there will be no gaps and it will be possible to form bright images more efficiently as a display apparatus.

Display Apparatus

If the lens optical element according to the present invention described above is used, it is possible to form a display apparatus that is similar to the display apparatus disclosed in Patent Literature 3 that was described with reference to FIG. 1. If the on-chip lens 14 shown in FIG. 1 is formed so as to satisfy the condition equation (1) or (2) that provides the critical condition that make it possible for the lens surface described earlier to appear uniformly bright, it is possible to realize a display apparatus where the entire lens surfaces of pixels that emit light appear with uniform brightness.

That is, if, for a light source array provided on the same substrate, a microlens array (an array of on-chip lenses) that is also a sealing member is formed so that the individual microlens parts satisfy condition equation (1) or (2), a display apparatus with a similar high resolution to a liquid crystal display apparatus and higher luminance than a liquid crystal display apparatus will be realized.

Using the lens optical element according to the present invention, it is also possible to realize a giant display apparatus which in practice will be set up outdoors. By laying out a plurality of lens optical elements according to the present invention in two dimensions, it is possible to construct a display apparatus. In such case, since it is not necessary to display at high resolution with a narrow pitch, it is not necessary to form the lens optical elements that construct the pixels in a small size. However, in such case also, by using lens optical elements according to the present invention where the on-chip lens is formed so as to satisfy the condition equation (1) or (2) as pixels, it is possible to produce a display apparatus with favorable characteristics in that the entire lens surfaces of pixels that emit light appear uniformly bright.

The preferred embodiments of the present invention have been described above with reference to the accompanying drawings, whilst the present invention is not limited to the above examples, of course. A person skilled in the art may find various alternations and modifications within the scope of the appended claims, and it should be understood that they will naturally come under the technical scope of the present invention.

The invention claimed is:

1. A lens optical element comprising:
an on-chip lens with a convex surface formed at a top part of a column-shaped portion; and
a light emitting surface disposed in a state where the light emitting surface is covered by a bottom portion of the column-shaped portion of the on-chip lens,
wherein the column-shaped portion of the on-chip lens is a regular polygonal column, and
whereas a radius $r_1$ of a circle inscribed in a regular polygon of a bottom surface of the regular polygonal column, a radius $r_2$ of a circumscribed circle, a lens height, which is defined as a height from the light emitting surface to a peak of the convex surface H, and a refractive index n of the structural material of the on-chip lens satisfy Equation (2) below $$H < 3(r_1+r_2)/2(n^2-1)^{1/2} \qquad (2),$$

wherein (r1+r2)>0 and n>1.

2. The lens optical element according to claim 1,
wherein the convex surface constructed at the top part of the on-chip lens is a spherical surface.
3. The lens optical element according to claim 1,
wherein the convex surface constructed at the top part of the on-chip lens is an aspherical surface.
4. A display apparatus constructed by disposing the lens optical element according to claim 1 in one dimension or two dimensions,
wherein the peaks of the convex surfaces are disposed at equal intervals.
5. The lens optical element according to claim 1,
wherein the column-shaped portion has a square shape.
6. A lens optical element comprising:
an on-chip lens with a convex surface formed at a top part of a column-shaped portion; and
a light emitting surface disposed in a state where the light emitting surface is covered by a bottom portion of the column-shaped portion of the on-chip lens,
wherein a relationship between a lens height, which is defined as a height from the light emitting surface to a peak of the convex surface, a thickness of the column-shaped portion, and a refractive index of a structural material of the on-chip lens is set so that when the light emitting surface emits light, a state is produced where the entire convex surface of the on-chip lens appears to have uniform brightness; and
wherein, for a given value of a critical angle of incident light that satisfies a total reflection condition of the sidewall surface of the column-shaped portion, a given value of the refractive index, and a given value of the thickness of the column shaped portion, the lens height is set lower than a height value that causes an intensity of a brightness distribution in a center position of the lens surface to increase, and
wherein the given value of the critical angle is 39°, the given value of the refractive index is 1.58, and the given value of the thickness of the column shaped portion is 100 μm, and the lens height is set at 40 μm.

* * * * *